United States Patent [19]

Bauer

[11] Patent Number: 4,647,361

[45] Date of Patent: Mar. 3, 1987

[54] SPUTTERING APPARATUS

[75] Inventor: Hans J. Bauer, Boeblingen, Fed. Rep. of Germany

[73] Assignee: International Business Machines Corporation, Armonk, N.Y.

[21] Appl. No.: 771,926

[22] Filed: Sep. 3, 1985

[51] Int. Cl.[4] .............................................. C23C 14/34
[52] U.S. Cl. .................................................... 204/298
[58] Field of Search ................ 204/192 R, 192 C, 298

[56] References Cited

U.S. PATENT DOCUMENTS

| | | | |
|---|---|---|---|
| 3,274,670 | 9/1966 | Lepselter | 29/155.5 |
| 3,290,127 | 12/1966 | Kahng et al. | 29/195 |
| 3,878,079 | 4/1975 | Schauer | 204/298 X |
| 3,892,650 | 7/1975 | Coumo et al. | 204/298 X |
| 3,893,160 | 7/1975 | Botzenhardt | 357/71 |
| 3,906,540 | 9/1975 | Hollins | 357/15 |
| 3,995,301 | 11/1976 | Magdo | 357/15 |
| 4,264,393 | 4/1981 | Gorin et al. | 204/298 X |
| 4,415,427 | 11/1983 | Hidler et al. | 204/298 |
| 4,444,635 | 4/1984 | Kobayashi et al. | 204/298 X |
| 4,473,455 | 9/1984 | Dean et al. | 204/298 |
| 4,512,841 | 4/1985 | Cunningham, Jr. et al. | 204/298 X |
| 4,545,115 | 10/1985 | Bauer | 29/590 |

OTHER PUBLICATIONS

"Microstructural and Electrical Properties of Thin PtSi Films and Their Relationships to Deposition Parameters" by R. M. Anderson et al., Journal of the Electrochemical Society, vol. 122, No. 7, pp. 1337–1347, Jul. 1975.

"3.5 Morphologies of RF Sputter–Deposited Solid Lubricants", by K. A. B. Anderson, et al., Vacuum, vol. 27, No. 4, pp. 379–382, 1977.

Primary Examiner—John F. Niebling
Assistant Examiner—Nam X. Nguyen
Attorney, Agent, or Firm—T. Rao Coca

[57] ABSTRACT

Disclosed is a sputtering apparatus wherein the wafer-holding plate is provided with openings for accommodating wafers therein. Each opening is of a size slightly smaller than that of the wafer and is provided with a peripheral step-shaped recess so that upon mounting the wafer therein the wafer's top surface is flush with the wafer-holding plate and a major portion of its back surface thereof is exposed. Mounted in close proximity to the wafer-mounting plate is a flat heating element which directly and quickly heats the wafers via their exposed back surfaces to the desired metal silicide forming temperature.

Disclosed too is a process of forming high quality metal silicide contacts by mounting the wafers covered with a contact mask on a wafer-mounting plate of a sputtering system such that the back surfaces of the wafers are exposed. After evacuating the system and establishing a positive argon pressure, sputter cleaning is accomplished to remove any native oxide formed in the wafer contact areas by applying a suitable RF potential to the wafer-mounting plate. Next, the cleaned wafers are heated by direct backside heating thereof to a desired predetermined temperature. Sputter deposition of the metal from the source on to the heated wafers and simultaneous conversion of the deposited metal into metal silicide by solid-vapor reaction between the metal vapor and the solid silicon is achieved. Alternatively, the wafer cleaning may be accomplished in a two-step process consisting of initially cleaning at room temperature followed by cleaning at a high temperature corresponding to the metal silicide forming temperature.

5 Claims, 6 Drawing Figures

SPUTTERING APPARATUS

BACKGROUND OF THE INVENTION

The invention relates to a sputtering system for deposition of materials on wafers and, more particularly, to a system having a perforated cathode accommodating the wafers in the perforations and a heating element in close proximity to the cathode for direct heating of the wafers. The method aspect of the invention relates to forming metal silicide contacts on the wafer by directly heating the wafer, sputter cleaning the contact openings, depositing the metal and in-situ converting the metal to metal silicide.

The present trend in semiconductor technology is toward very large scale integration and ultra large scale integration of devices with very high speed and low power dissipation. To achieve this, the devices are being shrunk in size by, for example, making the vertical junction structure shallower and reducing the horizontal geometry and the electrical resistance associated with the device contacts, interconnection metallization, etc. is being reduced. One extensively used metallurgy for providing both contacts (for example, Ohmic or Schottky barrier contacts which are obtained when a highly or lightly doped region of a silicon substrate are directly contacted, respectively) and interconnections in present circuits is a metal-silicon compound known as a silicide. In this context, silicides such as platinum silicide, palladium silicide, tantalum silicide, titanium silicide, hafnium silicide, zirconium silicide, molybdenum silicide, and tungsten silicide have been proposed. A metal silicide is typically formed by depositing the metal into the contact windows and reacting with the silicon at an elevated temperature.

Of the above silicides, platinum silicide (PtSi) has been particularly suitable because it is easy to form and extremely stable. Schottky diodes having PtSi contacts have near-ideal forward and reverse I-V characteristics.

Referring to the prior art on Ohmic contacts, U.S. Pat. No. 3,274,670 discloses forming low resistance electrical contacts to semiconductor devices by depositing on a silicon substrate a thin layer of platinum and heat treating to form platinum silicide. Thereafter, a composite layer of platinum, titanium and gold is deposited over the platinum silicide. U.S. Pat. No. 3,290,127 discloses forming platinum silicide as an active contact layer over the semiconductor. Silver-gold metallization is then formed over the contact layer. U.S. Pat. No. 3,893,160 discloses a resistive connecting contact for a silicon substrate formed from a layer sequence of platinum silicide-titanium-molybdenum-gold.

Referring to the prior art on Schottky barrier contacts, it is known from U.S. Pat. No. 3,906,540 to form on a silicon body a platinum silicide layer, then applying a refractory metal barrier such as molybdenum, titanium, tungsten, tantalum, followed by forming an aluminum contact layer. The refractory metal barrier prevents intra-diffusion of aluminum and silicon constituents during subsequent heat treatments. U.S. Pat. No. 3,995,301 discloses an Al$_2$Pt Schottky barrier contact structure obtained by first forming platinum silicide on a silicon substrate, applying an aluminum layer thereon followed by sintering.

The above discussed refractory metals are deposited by sputtering or electron beam evaporation, the former being the most common method. The sputtering systems disclosed in the articles entitled "Micro-structural and Electrical Properties of Thin PtSi films and Their Relationships to Deposition Parameters" by R.M. Anderson et al, *Journal of the Electrochemical Society*, Vol. 122, No. 7, pp. 1337-1347, July 1975 and "3.5 Morphologies of RF Sputter-deposited Solid Lubricants" by K. A. B. Andersson et al, *Vacuum*, Vol. 27. No. 4, pp. 379-382, 1977 are representative of the conventional sputter apparatus used for depositing platinum. Typically, in a prior art sputtering apparatus the semiconductor wafers to be coated are arranged on a substrate holder plate mounted inside a processing chamber. The source of refractory metal is arranged as a target plate inside the chamber. A positive pressure of an inert gas such as argon or nitrogen is maintained in the chamber. A suitable radio frequency (RF) is applied between the target plate and the substrate holder plate making them the anode and cathode, respectively. By high energy collision, the gas ions will eject particles from the target which traverse the chamber and deposit on the wafers.

To convert the deposited refractory metal into its corresponding silicide, the wafers are heated to the necessary temperature at which the metal-silicon reaction takes place. For example, for PtSi formation the temperature should be at least about 350° C. Different techniques for heating the wafers have been proposed in the prior art. One such technique, which is disclosed in the article by R. M. Anderson et al, supra, is by contacting the substrate holder plate with a copper block having an electrical heater element embedded therein. Another technique, which is disclosed in U.S. Pat. No. 5,545,115 by H. J. Bauer et al and assigned to the present assignee, is by means of a heating coil arranged at a distance behind the holder plate. In both these techniques, since the wafers are not heated directly, but instead the wafer holder plate is first heated, followed by thermal conduction of the heat from the holder plate to the wafers, inordinately long times will be necessary to form the silicide. Such long times are unsuitable for high volume manufacturing of integrated circuit contacts. Another disadvantage of this prior art technique is nonuniform heating of the wafers due to nonplanarity associated with the mutually contacting surfaces of the wafers and the holder plate. In other words, due to inherent wafer warpage and the holder plate surface being not perfectly flat, significant gaps exist between the wafer and the holder plate surfaces rendering heat transfer from the plate to the wafer portions corresponding to the gap significantly less than that to the remaining portions. As a result, "cold zones" are established in the wafer which would inhibit formation of the silicide contacts therein.

Another prior art technique for heating the wafers is by utilizing high intensity lamps mounted inside the processing chamber either behind or in front of the wafer holder plate. When the lamps are mounted behind the plate, the disadvantages enumerated hereinabove will heating coils will result. When the lamps are mounted in the front, they tend to be ineffective to rise the temperature of the wafers to the silicide-forming temperature since the first, thinnest platinum layer deposited on the wafer, due to its high reflectivity, tends to reflect off the light. Another disadvantage with lamp heater is that during the sputtering process the platinum will deposit on the lamp surface rendering the lamp to be an ineffective heat source. Yet another disadvantage with lamp heater is that it tends to introduce alkali contaminants such as sodium present in the glass casing of the lamp into the contact areas degrading the contact characteristics. Another disadvantage is that since a lamp heater radiates heat to the entire process chamber including the chamber walls and fixtures, water vapor, oxygen, etc. are released which tend to be incorporated into the wafers, typically in the form of a thin native silicon dioxide layer in the contact openings, rendering the silicide contacts of poor quality.

Accordingly, it is an object of the invention to provide a sputtering apparatus which allows rapid heating of the wafers for forming metal silicide thereon.

It is a further object of the invention to provide a sputtering apparatus which permits sputter cleaning of the wafer contact windows prior to metal deposition and conversion to metal silicide following the metal deposition.

It is still another object of the invention to provide a reliable method of forming high quality metal silicide contacts to a silicon workpiece.

SUMMARY OF THE INVENTION

The above objects and other related objects and advantages may be achieved through the use of a novel sputtering apparatus herein disclosed. In one illustrated preferred embodiment of this invention, a sputtering apparatus is provided wherein the semiconductor wafer holding plate is provided with openings for accommodating the wafers therein. Each opening is of a size slightly smaller than that of the wafer and is provided with a peripheral step-shaped recess or depression. Consequently, upon loading a wafer in an opening, the wafer top surface is substantially coplanar with the wafer holding plate and a major portion of the wafer back surface is exposed. The loaded wafer holding plate, despite the openings therein, functions as a single continuous cathode plate and provides the necessary uniform electric field to accomplish sputtering, etc. when a suitable RF potential is applied between it and the walls of the process chamber which, being maintained at ground potential, serve as the anode.

Mounted in close proximity to the cathode for directly heating the wafers from the back surfaces thereof is a high-resistance heating element. In one embodiment, the heating element is of a flattened configuration consisting of a wire, such as nickel-chromium or tungsten, held in place and shape by means of a plurality of ceramic separator pairs having grooves for engaging the wire therein. The distance between the heating element and the cathode can be adjusted by moving the cathode relative to the heating element. Since the heater element is essentially uncovered, it quickly heats up upon passing an electrical current therethrough. Since the wafers are heated by direct absorption of the heat via their exposed back surfaces, the desired silicide-forming temperature is readily attained.

In accordance with the process aspect of the invention, high quality metal silicide contacts are formed by loading the wafers covered with a contact mask into the recesses of the cathode plate openings. The metal source to be sputtered into the contact areas is arranged in the form of a plate in the vicinity of the cathode. After evacuating the process chamber and introducing an inert carrier gas, such as argon, to maintain a predetermined positive pressure therein, the heating element is turned on. By direct backside heating, the wafers are heated quickly to the desired predetermined metal silicide forming temperature. Thereafter, a short sputter etching step is accomplished by applying a suitable RF voltage between the cathode and the ground shield to remove any native silicon dioxide layer present in the contact areas. Alternatively, the native oxide is removed in a two-step process by initially sputter etching at room temperature followed by sputter etching at the silicide-forming temperature. Once the native oxide is removed, metal deposition and in-situ conversion, by vapor-solid reaction, of the metal (vapor) in the silicon (solid) contact areas to metal silicide is accomplished, both at the same temperature and in the same sputtering system.

BRIEF DESCRIPTION OF THE DRAWINGS

The novel features, elements, individual process steps and their combination characteristic of the invention are set forth in the appended claims. The invention itself, however, will be best understood by reference to the detailed description which follows in conjunction with the accompanying drawings, wherein:

DETAILED DESCRIPTION OF THE PREFERRED EMBODIMENTS

Figure 1:
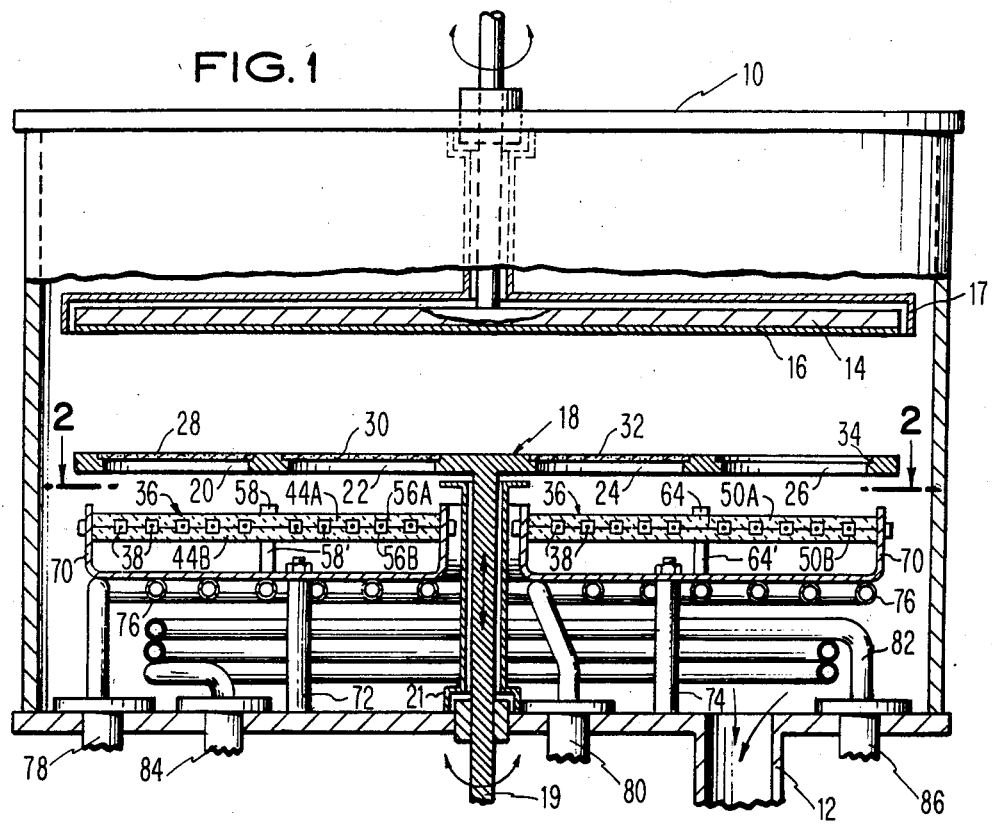
FIG. 1 shows a schematic sectional view of one embodiment of a batch sputtering apparatus in accordance with the principles of the present invention.
Figure 2:
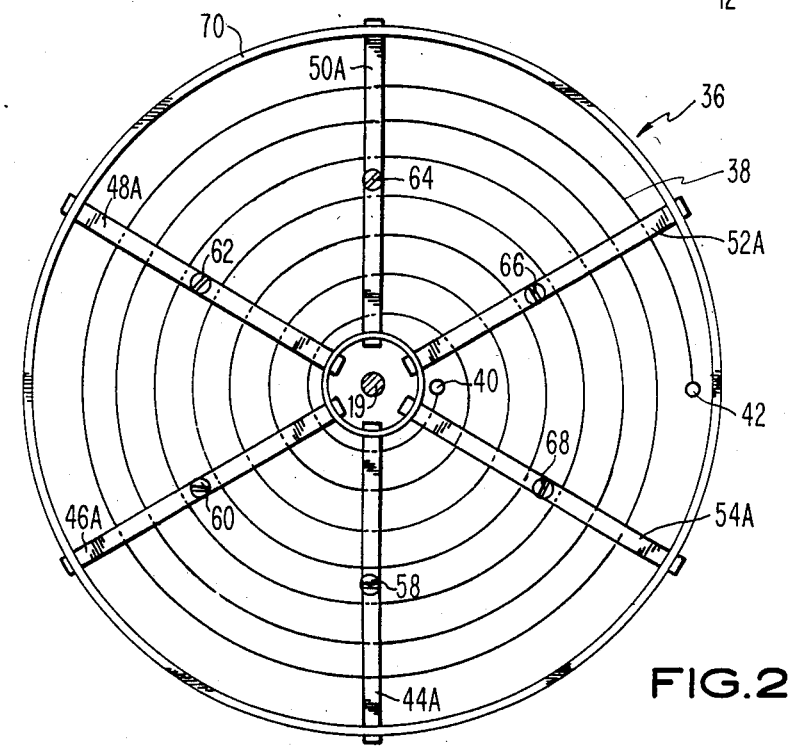
FIG. 2 is a plan view of the heater assembly of the apparatus of FIG. 1.

Referring now in more detail to the drawings, particularly the specific illustrative apparatus shown in FIGS. 1 and 2 thereof, 10 designates a process chamber. Chamber 10 is of suitable mechanical construction which permits it be pumped down to a high vacuum via outlet 12. The process chamber is fitted with a gas inlet port (not shown) which is connected to a source of gas which is used to facilitate sputtering, including sputter deposition of materials and sputter clenaing of surfaces. Arranged inside the chamber 10, near the ceiling thereof, is a rotatable target mounting plate 14 having a diameter slightly smaller than that of the process chamber. The mounting plate 14 is made of a conductive material such as stainless steel or copper and serves as the cathode during the deposition process. Affixed to the target plate 14 is the source material 16 for deposition on the workpieces (e.g., semiconductor wafers). The source 16 is also referred to herein, in accordance with conventional usage, by the term target. Typical targets for semiconductor contact formation include platinum, palladium, molybdenum, tungsten and aluminum.

Encasing the cathode 14 is an electrically conductive shield 17 which is maintained at ground potential. The shield 17 serves to prevent sputtering off of the material from cathode and deposition thereof on the wafers during sputter deposition. The exact mechanism by which the shield 17 accomplishes this function is well-known and need not be elaborated upon here.

The process chamber 10 is fitted in the inside portion thereof with a rotatable and vertically translatable semiconductor wafer holding plate 18 having a diameter comparable to that of the target mounting plate 14. The wafer holding plate 18 is provided with a plurality of circular slots or openings 20–26 of a diameter slightly smaller than that of the wafers for accommodating a single wafer in each opening/slot. For clarity of illustration, the openings 20–24 have been shown as being loaded with semiconductor wafers 28–32, respectively, while the opening 26 is shown as being unfilled. Each of the openings is provided, as illustrated with respect to the opening 26 in FIG. 1, with a narrow peripheral step-shaped recess or depression 34 so that, upon loading a wafer in an opening, the wafer front/top surface is coplanar with the wafer holding plate and a major portion of the wafer back/bottom surface is exposed. The wafer holding plate 18 is typically made of an electrically conductive material which is not reactive to the sputtering process. Typical materials for fabricating the plate 18 include molybdenum and stainless steel coated with a refractory metal. The loaded wafer holding plate 18, despite the openings therein, functions as a single continuous cathode plate when a suitable radio frequency (RF) potential is applied between it and the walls of the process chamber 10, which being maintained at ground potential serves as the anode, and provides the necessary uniform electric field to accomplish sputtering. To minimize physical contact between the wafers and the wafer holding plate, since such contact causes undesirable thermal conduction of heat from hot wafers to the wafer holding plate, a plurality of insulative standoffs are symmetrically arranged within the recesses 34 of the openings 20–26. Also, to facilitate wafer loading and unloading, tweezer grooves may be provided for each opening in the plate 18.

The holding plate 18 is affixed to a shaft 19 which not only enables vertical translatory motion and rotation of the plate 18, but also functions as a means for applying the RF to the plate 18. Surrounding the shaft 19 is ground shield 21. The shield 21, which is maintained at ground potential, prevents removal of material from the shaft 19 during the sputter-cleaning process.

Positioned in close proximity to the wafer holding plate 18 is a high-resistance heating element generally designated by the numeral 36 for heating the wafers from the exposed back surfaces thereof. In the embodiment shown in FIGS. 1 and 2, the heating element is a flattened continuous coil of wire 38 in a circular configuration having its starting point at 40 and termination point at 42. The nature and diameter of the wire 38 should be such that upon connecting the points 40 and 42 to a current source, the coil not only heats up quickly, but also radiates significant thermal energy for heating the wafers directly thereabove. The diameter of the wire 38 is dictated by the nature of the sputtering system, i.e., whether it is a single wafer or batch system and in the latter case the size of the batch. Typically, the diameter of the wire is in the range of 0.5–2.5 mm. Typically, the nature and characteristics of the coil 38 be such that it is capable of generating about 10,000 watts of power. The preferred materials for constructing the coil 38 of the heater element 36 are those having a high electrical resistance, sufficient mechanical strength at high temperatures, high melting point and low evaporation rate suitable for vacuum applications. Specific preferred materials for constructing the coil 38 include nickel or chromium alloys such as nickel-chromium (NiCr), iron-chromium, etc., tungsten and tantalum. In the case of tungsten, the coil is fabricated from a stand of three or four thin single wires to obtain high emissivity.

Referring to FIGS. 1 and 2, the coil of wire 38 is held in place and shape by means of a plurality of mating wire separator pairs each having a plurality of matched grooves for engaging the wire therein. A preferred material for constructing the wire separators is ceramic due to its ability to withstand high temperatures. In the illustrated preferred embodiment (FIG. 2) is shown six pairs of ceramic separators designated 44A/44B to 54A/54B, wherein the numeral with postscript A designates the top separator and the numeral with the postscript B designates the bottom separator. Focussing on the ceramic separator pair 44A/44B as illustrated in FIG. 1, a groove in the top separator 44A is designated by 56A and the corresponding groove in the bottom separator 44B is designated by 56B. The separator pairs are mechanically held together and affixed by means of screws 58–68, respectively, to thermally insulative pedestals 58'–68' positioned, as illustrated in FIG. 1 in the interior of a heater housing 70.

The wire separator pairs 44A/44B–54A/54B are designed to be narrow and thin to minimize shielding and absorption, respectively, of the heat from the heater wire 38. In other words, in spite of the presence of the wire separators, the heater coil is essentially fully exposed.

The heater housing 70 (also referred to herein simply as pan) is shaped in the form of a hollow doughnut with its top half sliced off. Additionally, the pan 70 may have a flat floor as illustrated in FIG. 1. The pan 70 is rigidly affixed to the floor of the process chamber 10 with the aid of a plurality of standoffs 72 and 74 constructed out of a material such as stainless steel. A suitable material for constructing the pan 70 is stainless steel due, among other properties, to its ability to sufficiently reflect the radiation from the heater coil 38 to the wafers 28–32 and withstand high temperatures and minimal propensity to introduce contaminants into the process chamber during the sputtering. Pan 70 is cooled by circulating cold water through a conduit 76 having an inlet 78 and outlet 80 provided at the outer bottom surface thereof. Cooling of the pan 70 is advantageous. Otherwise, heat generated during the sputtering process may cause the pan material to outgas, thereby deleteriously affecting the end result of the sputtering process.

The process chamber 10 is also fitted with a Meissner trap 82 to reduce water vapor and thereby help achieve high vacuum conditions inside the chamber. The Meissner trap 82 contains an inlet 84 and an outlet 86 for introducing and exhausting, respectively, a cryogenic fluid such as liquid nitrogen.

Having described the salient features of the sputtering apparatus of the invention, the operation of the apparatus and the process of forming high quality platinum silicide contacts in accordance with the principles of the present invention will now be briefly traced. Referring to FIGS. 1 and 2, the work-pieces, for example, monocrystalline silicon wafers covered with a contact mask exposing only the areas of the silicon where silicide contacts are desired to be formed are arranged in the slots 20–26 of the wafer holder 18. Each wafer occupies, with its top/front surface facing the target 16, one recessed pocket of the wafer holder such that upon completion of the assembly, the top/front surface of each wafer is essentially flush with the top surface of the wafer holder 18 and the wafer back/bottom surfaces are fully exposed to facilitate direct heating from below. The vertical spacing between the wafers' bottom surfaces and the heater coil 38 is adjusted to be in the desirable range of about 1-4 cm. by moving the wafer plate 18 relative to the heater housing 70. Likewise, the vertical spacing between the top surfaces of the wafers and the target 16 is adjusted to be in the range of approximately 3-6 cm. by, for example, moving the target holder 14 relative to the wafer holder 18. The target 16 is single element high purity (99.999% or better) solid platinum.

Once the wafers are loaded and the wafer holding plate and target are properly positioned, the process chamber is evacuated to a low pressure in the range of approximately $10^{-7}$ Torr or less. The process chamber 10 is then backfilled with pure (99.9999% or better purity) argon gas obtaining an argon pressure in the chamber in the range of about $10^{-2}$ to $10^{-3}$ Torr while maintaining an argon flow rate of about 5 standard cubic centimeters per minute. Although gases such as hydrogen and helium may be utilized for the sputtering process, argon is preferred not only because it is chemically inert, but also the argon atomic mass is relatively large. Larger mass, when subjected to the same RF field, translates into a larger momentum which when transferred to the target surface causes effective sputtering.

The next step in the present process is sputter etching of the exposed contact windows to remove any native oxide layer formed therein. The native oxide is a thin layer of silicon dioxide formed typically by oxidation of the exposed silicon regions caused by the presence of oxygen and water vapor residues in the process chamber. Sputter cleaning of the wafer contact areas is accomplished by applying a suitable negative RF potential of 600-1300 volts to the wafer plate 18 utilizing, for example, a 13.56 MHz generator and a tuning network to match the generator. In other words, the wafer plate is made negative with respect to the walls of the chamber 10 and the ground shield 21. As a result of this RF field generated within the process chamber 10 ionized argon gas atoms are attracted to the wafer plate 18 causing them to collide with the wafers and etch off the native oxide.

The sputter etching process to remove the native oxide is accomplished in a two-step sequence. First, etching is initiated at room temperature for a short period of time in the range 3-5 minutes. The etching is then temporarily suspended by turning off the RF applied to the wafer holding plate. The heater element 38 is then turned on by passing a current therethrough which owing to its unique design quickly turns red hot and radiates heat to the bottom surfaces of the wafers 28-32. Due to this direct heating of the wafers via their exposed bottom surfaces, the wafers readily absorb heat and attain a uniform temperature dictated by the heater current. The argon pressure in the process chamber 10 is maintained under steady state conditions throughout the heating. To complete the sputter etching of the native oxide, the wafers are heated to a fixed temperature in the range of approximately 350°-550° C. After maintaining the wafers in this environment for about 5-10 minutes, sputter etching of the native oxide is completed by reapplying the RF to the wafer plate rendering it negative relative to the walls of chamber 10 and the ground shield 21 analogous to the initial room temperature sputter etching step. Sputter etching of the heated wafers is continued for a short period, about 3-5 minutes, to remove not only any original native oxide remaining following the initial cold wafer etching step, but also any nascent oxide formed in the exposed silicon contact windows due to outgassing of oxygen, water vapor, etc. by the various portions of the fixtures possibly heated by the heater coil during the heating of the wafers. This in-situ sputter cleaning step is desirable since the contact windows will be rendered perfectly free of oxide, thereby insuring high quality Ohmic and non-Ohmic silicide contacts. Following the sputter cleaning process, the RF is turned off.

Alternatively, the sputter etching process to remove the native oxide in the contact windows may be accomplished in a single step, corresponding to the final step of the above two step process. The duration of this single etch step is generally longer, typically about 5-10 minutes.

Progressing toward the next step in the present process, the wafers are now ready for deposition of the platinum material from the source 16. To accomplish this, the temperature of the wafers may be maintained at the temperature prevailing at the completion of the sputter etching step or, alternatively, increased by increasing the heater current in the coil 38. If it is desirable to increase the temperature, a short 3-5 minute waiting is done to stabilize the temperature of the wafer and attain steady state conditions in the process chamber prior to the metal deposition. Next, a high negative DC potential of 800-1000 volts is applied to the target plate 14 relative to the wafer plate, ground shield 17 and the walls of the process chamber 10. Under these pressure and voltage conditions, a desirable platinum deposition rate of 2-5 Å/sec. is obtained. (Alternatively, a suitable RF potential may be applied to the plate 14 to obtain the same platinum deposition rate). Due to the high applied DC potential, an argon plasma and its associated dark space region are formed directly below the surface of the cathode 14. As a result of the high uniform electric field that is established between the cathode 14 and the dark space of the argon plasma argon ions are generated within the electric field. The argon ions so generated are attracted to the cathode 14. Consequently, the argon ions accelerate to a high speed and collide with the extended surface of the platinum source 16. Due to the momentum imparted during these collisions by the argon ions to the target's lattice structure, platinum particles of atomic dimensions are ejected from the target. The target-ejected or sputtered particles traverse the process chamber under viscous or transitional flow conditions from the extended target surface 16. The sputtered particles travel across the gap between the source 16 and the wafer holder plate 18 and deposit as a thin film on the hot wafers arranged thereon. When argon ions strike the target, their electrical charge is neutralized and they return to the process as atoms. Secondary electrons are generated during the ejection of target particles and these electrons serve to sustain the glow discharge by ionizing neutral argon atoms.

Immediately upon deposition of a thin monolayer of platinum in the contact windows of the silicon wafers, the platinum material will, due to the high temperature at which the wafers are maintained, react with the silicon and convert in-situ into platinum silicide. Since the reaction between the platinum (vapor) and the silicon (solid) is a vapor-solid reaction, excellent intermixing of the platinum and silicon atoms occurs which not only promotes the adhesion of the platinum silicide to the silicon, but also eliminates voids and other structural defects, in particular, high tensile stress in the platinum silicide film and the resulting strain at the PtSi-Si boundary regions normally associated with the conventional platinum silicide processes which are responsible for electromigration, excessively high localized current densities, etc. In other words, the resulting contacts are microstructurally and electrically superior.

The platinum deposition and in-situ heat treatment step converting platinum to platinum silicide is continued until a desired thickness is attained for the contact. Typically, the platinum deposition and in-situ conversion to silicide is accomplished for about 1-3 minutes obtaining a 300-800 Å thick platinum silicide.

The source mounting plate 14 and/or the wafer holding plate 18 may be rotated as desired during the sputter deposition and etching steps as desired to enhance uniformity and consistency of platinum deposition or oxide etching, as the case may be. Any suitable drive arrangement may be utilized for rotating the plates 14 and 18 at desired speeds and synchronizations.

The processing at this point is substantially complete as far as the novelty of the present invention is concerned. The balance of the processing is conventionally performed which includes removal of the unreacted platinum by etching in aqua regia and deposition of the metallization system contacting the platinum silicide.

Figure 3A:
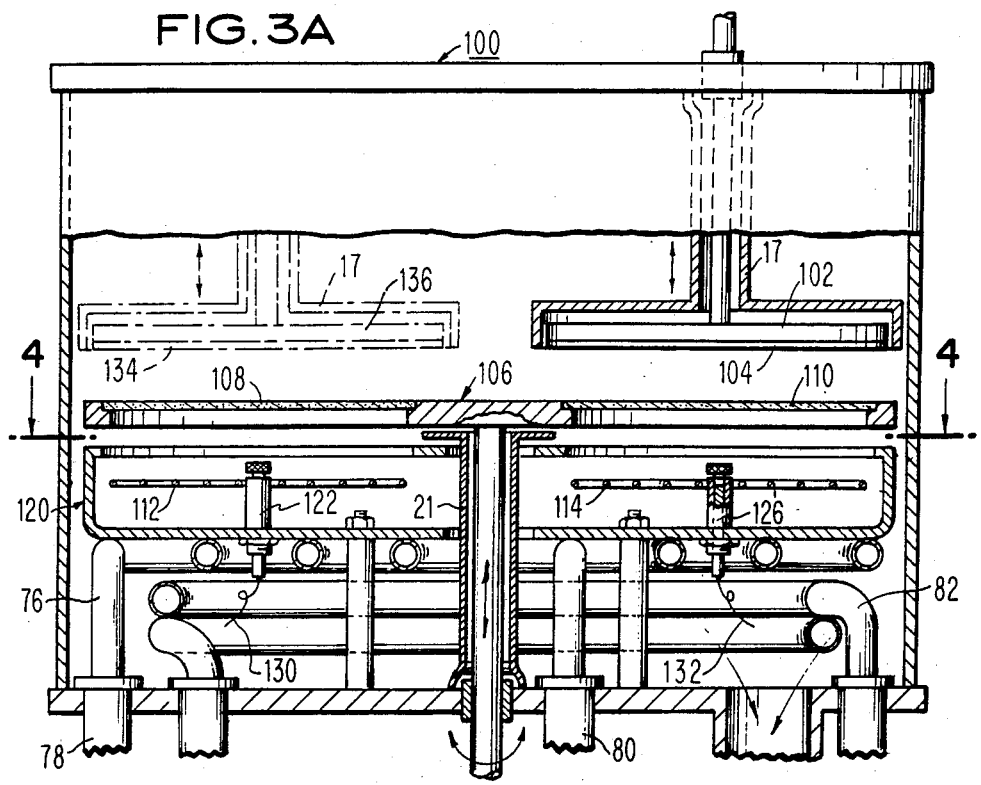
FIGS. 3A and 3B show schematic cross-sectional views of three other embodiments of the sputtering apparatus in accordance with the principles of the present invention.
Figure 4:
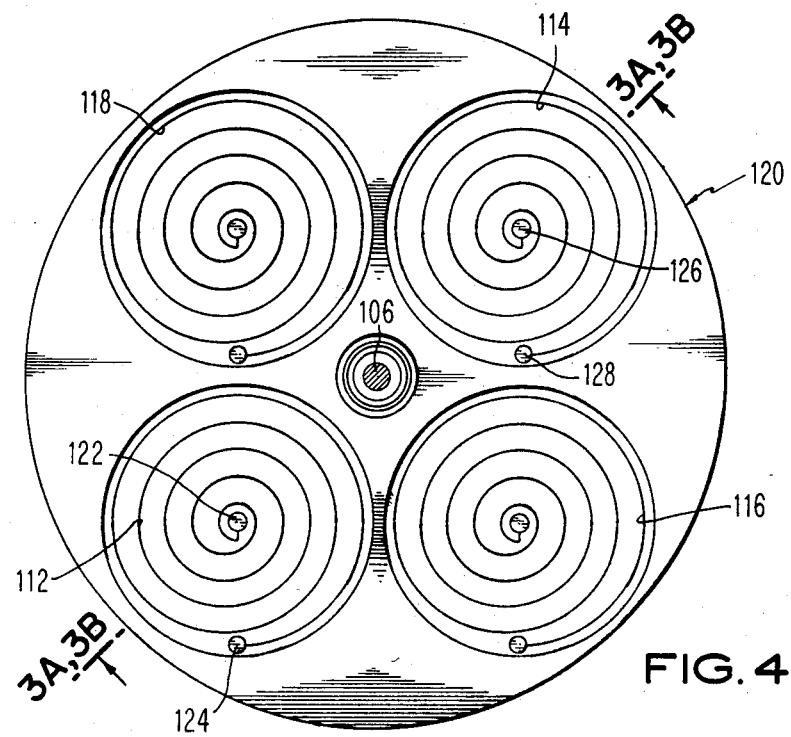
FIG. 4 is a top view of the heater assembly of the apparatus as of FIGS. 3A and 3B.
Figure 3B:
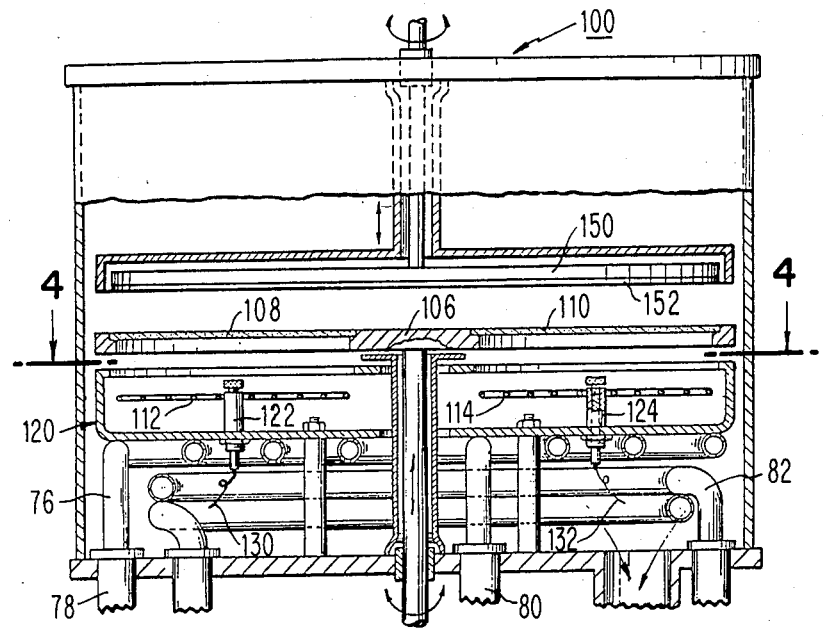

Alternative embodiments of the apparatus of the invention will now be discussed. Referring to FIGS. 3A, 3B and 4, and in particular FIGS. 3A and 4, there is shown in these figures a batch (illustratively, a batch of four) processing sputtering apparatus 100 which enables sectorial sputtering. The circular target mounting plate 102 and the source/target material (e.g., platinum) 104 affixed thereto do not extend over the entire wafer mounting plate 106, but instead is limited to one section (also called deposition zone herein) of the plate 106. The common diameter of the plate 102 and target 104 is typically somewhat larger than that of a wafer 108 or 110. The wafers 108 and 110 are mounted in the openings having a peripheral recess provided in the wafer holding plate 106 analogous to those in plate 18 of FIG. 1 apparatus such that their bottom surfaces are exposed for direct heating from below. Focusing on the novel features only, the heater assembly in the present embodiment consists of four individually controlled heater coils 112-118, for individually and directly heating each of the wafers mounted on the plate 106. Each of the heater coils 112-118 is spirally shaped and is affixed to the heater housing 120 by means of a pair of ceramic supports such that the heater coils are perfectly aligned with the openings in the plate 106. The ceramic support pair for coil 112 are designated by numerals 122 and 124, and those for coil 114 are designated by 126 and 128. The ceramic supports 122, 124, 126, 128 carry electrical wires to feed an electrical current to the respective coils. Two such wires 130 and 132 in supports 122 and 126, respectively, are illustrated in FIG. 3A.

The apparatus 100 illustrated in FIGS. 3A and 4 is fitted with a Meissner trap 82 to enhance the high vacuum conditions inside the process chamber, water cooling means 76 for the heater housing 120, electrical ground shields 21 and 17 surrounding the shaft of the wafer-mounting plate 106 and the target-mounting plate 102, respectively, in a manner akin to the apparatus shown in FIG. 1.

A distinctive advantage of the apparatus shown in FIGS. 3A and 4 is that since each of the wafers 108, 110, etc. is provided with its own individual heater of a size the same or slightly larger than that of the wafer, radiation of heat from the heater is basically confined to the wafer. In other words, heating of the wafer-holding plate 106 is minimized thereby keeping the outgassing of the plate 106 at a low level.

The salient aspects of the mode of operation of the apparatus disclosed in FIGS. 3A and 4 is as follows:

The silicon wafers masked with a contact mask are loaded into the openings 108, 110, etc. of the wafer holding plate 106. The process chamber, which is at room temperature, is pumped down to a low pressure, typically about $1 \times 10^{-7}$ Torr or lower. Argon gas is then bled into the chamber and a flow rate thereof is maintained therein to achieve an equilibrium pressure of about $1 \times 10^{-2}$ to $1 \times 10^{-3}$ Torr. RF is then fed to wafer holding plate 106 for about 2-3 minutes to remove any native oxide in the contact openings of the wafers 108, 110, etc. Following the oxide removal, the heating cycle commences. In this cycle, the current in each of the four heater coils 112 to 118 is set at a uniform level sufficient to raise the temperature of the wafers, by direct backside heating thereof by the corresponding heaters, in the range of 350°-550° C. This temperature range is the preferred range for forming platinum silicide in-situ during platinum deposition. The argon gas pressure is maintained in the process chamber throughout the heating cycle.

Once the wafers attain a steady temperature in the indicated range, a negative voltage in the range 400-800 volts is applied to the cathode 102 to sputter off about 150-300 Å of platinum from the target 104 and cause the sputtered platinum to deposit on the hot silicon wafer 110 directly therebelow. The preferred platinum deposition rate, which is controlled by regulating the DC voltage applied to the cathode 102, is in the range 2-5 Å/sec. The platinum material deposited in this manner in the oxide-free contact areas of the heated silicon wafer will instantaneously transform into a high quality and highly adherent platinum silicide by solid-vapor reaction between the solid silicon and the platinum vapor. When the desired thickness of platinum silicide is obtained as a direct consequence of this in-situ platinum deposition and conversion in the contact areas of the wafer 110, the wafer holding plate 106 is rotated through 90° bringing the next wafer to the deposition zone directly underneath the platinum target 104 to form the platinum silicide contacts thereon. The deposition process is not interrupted as the second wafer is rotated into the deposition zone. After forming platinum silicide in this manner by successive deposition on each wafer, the heater coils corresponding to the positions of the completed wafers are successively turned off.

Another mode of operation of the apparatus of FIGS. 3A and 4 is by setting the heater coils 112 to 118 to different current levels. Typically, the current in the heater coil 114 which is in correspondence with the target 104 (i.e., the coil corresponding to the deposition zone) is set to a high level to heat the wafer directly thereabove to a high temperature, for example, about 500° C. equal to the silicide forming temperature. The current in the remaining three coils is set to a low level sufficient to pre-heat the wafers thereabove to a moderate temperature of about 300° C. In this mode of operation, all the wafers are initially sputter cleaned at room temperature for about 2-3 minutes to remove the native oxide from the contact areas. Following the sputter etching step, different electrical currents are passed through the coils as discussed above raising the temperature of the wafer ready for silicide formation to a high temperature of about 450°-500° C. while maintaining the other three stand-by wafers at a pre-heat temperature of about 300° C. The argon gas flow and pressure in the process chamber is maintained as before. When the temperature of the wafer in the deposition zone is stable within ±10° C. of the temperature desired for platinum deposition and in-situ platinum silicide formation, platinum is sputtered at a rate of about 2-5 Å/sec. Provision may be made for a short warm-up period for each wafer moved from the stand-by zone to the deposition zone to stabilize the wafer temperature prior to deposition. The heater coils are turned off as each wafer is rotated out from underneath the platinum source.

A third embodiment of the invention, which is illustrated in phantom in FIG. 3A, includes a second sputter source 134 which is attached to a second target mounting plate 136 which is of the same diameter as the first target mounting plate 102. The second source 134 is typically a different material than the first source 104, for example titanium tungsten. This apparatus fitted with a dual source enables formation of a second conductive layer on an initial layer, for example, to form a barrier layer of titanium tungsten on the platinum silicide contact. Another useful purpose of the dual target system is to form conductive contacts composed of an intermixture of two metals.

Yet another embodiment of the sputtering apparatus in accordance with the invention is illustrated in FIG. 3B. In this embodiment instead of a single or multiple off-centered source(s) like the embodiments shown in FIG. 3A, a single source 152 attached to a single target plate 150 and centered inside the process chamber is provided. The target plate 150 and the source 152 extend over the entire wafer mounting plate 106 permitting simultaneous platinum deposition on the entire batch of wafers. This embodiment has the advantage that each of the wafers is heated directly from the backside thereof by means of a personalized heater element arranged therebelow. Such personalized heater permits tailoring of the silicide contacts in accordance with the characteristics of the wafer material.

Figure 5:
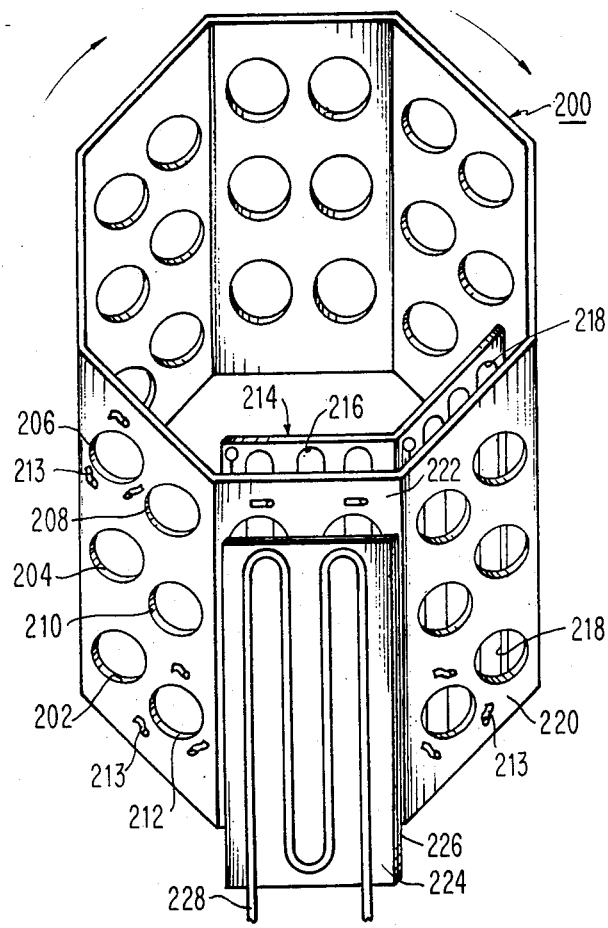
FIG. 5 shows a perspective view of vertical hexagonal cathode/wafer-mounting-plate with multi-sector heater assembly for batch processing of semi-conductor wafers in according with the principles of the present invention.

Reference is now made to FIG. 5 wherein is shown a vertical hexagonal-faceted wafer mount or electrode 200, each facet thereof having a plurality of openings 202-212 for accommodating wafers therein. As in the other two disclosed embodiments, each of the openings is provided with a peripheral depression or recess so that upon loading the wafers therein the wafer front surfaces are flush with the surface of each facet. Each wafer is held in place in the recesses by means of a plurality of wafer mounting clips 213. In the embodiment illustrated in FIG. 5, a maximum of 48 wafers can be processed in a single batch. The electrode is capable of rotation on a vertical axis by a drive means (not shown).

Arranged in close juxtaposition in a conforming parallel relationship with two adjacent facets of the electrode 200 is a heater assembly 214. The heater assembly 214 consists of two individually controlled heating elements 216 and 218 made of a high resistance wire such as NiCr, tantalum or tungsten wire. The resistance wire is installed on the heater mounting plate 214 in the same manner as that shown in FIGS. 1 and 2 using ceramic separators (not shown). The heating elements are of a design such that the entire group of wafers affixed to a facet of the hexode 200 can be uniformly and quickly heated by direct backside heating thereof. The heating element 218 serves to preheat the group of wafers arranged on the facet 220 of the hexode 200 which is in immediate and parallel correspondence therewith. The heating element 216 serves to heat the wafers affixed to the facet 222 to the final desired temperature for sputter deposition. Parallel to the heating element 216 and on the other side of the facet 222 is provided a target mount plate 224 which carries on the surface facing the facet 222 the source material 226 to be sputtered on the wafers. On the opposite surface of the target mount 224 is providing a cooling coil 228 having cold water flowing therethrough for controlling the temperature of the source.

In operation, the wafers are mounted in the recesses of the hexode 200 and held in place by clips 213. The process chamber is pumped down to a low pressure as before followed by introduction of and maintenance of a positive argon pressure in the process chamber of about $10^{-2}$ to $10^{-3}$ Torr. Then, by applying an RF potential to the electrode 200 sputter etching to remove native oxide in the contact areas of the wafers is accomplished. Thereafter, an electrical current is passed through the heating elements 216 and 218 to heat the wafers mounted in the facets 220 and 222 for, typically about 5-8 minutes raising the temperature of these wafers to the desired silicide-forming temperature, typically, about 500° C. Platinum is then sputtered from source 226 on to the wafers mounted in facet 222 by applying a negative DC potential to the cathode 224. As before, the platinum deposited in the silicon contact areas will react and convert in-situ in to platinum silicide. By maintaining these conditions, a desired thickness of platinum silicide of about 300-800 Å is formed. Next, the hexode 200 is rotated by 45° to bring facet 220 directly in front of the source 226 for forming silicide on the next group of wafers. The current in the heating element 218 is controlled in such a way that the wafers mounted on facet 220 attain the desired temperature and would be ready for platinum deposition and in-situ conversion at the same time when the platinum silicide formation on wafers mounted on facet 222 is complete. In this manner platinum deposition can be accomplished continuously without interruption. When the hexode has made a complete rotation, silicide formation on the entire batch of wafers is complete.

Thus, there has been provided in accordance with the invention, a sputtering apparatus and a method of forming metal silicide contacts that fully satisfies the objects and advantages set forth.

While the invention has been set described in conjunction with preferred embodiments, it is evident that many alternatives, modifications and variations will be apparent to those skilled in the art in light of the foregoing description. It is therefore contemplated that the apended claims will embrace any alternatives, modifications and variations as fall with the true scope and spirit of the invention.

What is claimed is:

1. A sputtering apparatus comprising:
   an enclosed vessel;
   a plate electrode rotatably mounted inside said vessel, said electrode having a plurality of openings, each of said openings having a peripheral depression for accommodating a semiconductor workpiece therein with the top surface of said workpiece in a substantially coplanar relation with the top surface of said plate electrode and a substantial portion of the back surface of said workpiece exposed; first and second conductive source mounting plates each having a size substantially the same as that of a workpiece, said source-mounting plates mounted inside said vessel from the ceiling thereof in a first and second off-centered locations such that said first plate is positioned in direct correspondence with and above one of said workpieces and said second plate is positioned in direct correspondence with and above another of said workpieces; first and second source materials of a plate configuration rigidly attached to said first and second plates, respectively, to face said one and another workpiece, respectively; and a plurality of heating elements, one heating element per workpiece, mounted in close proximity and directly below the corresponding workpiece for directly heating said corresponding workpiece from the exposed back surface thereof.

2. The apparatus as recited in claim 1 wherein said first and second source material is selected from a group consisting of platinum, molybdenum, palladium, tungsten, titanium-tungsten and aluminum.

3. A sputtering apparatus comprising:

an enclosed vessel;

a long hexogonal-faceted electrode rotatably and vertically mounted in said vessel to project from the bottom of said vessel, said electrode having a plurality of openings in each facet thereof, each of said openings having a peripheral depression for accommodating a semiconductor workpiece with the front surface of said workpiece in a substantially coplanar relation with the surface of the corresponding facet and the back surface of said workpiece being substantially exposed through said opening;

a first planar heating element mounted interior to said electrode to be in close proximity with and parallel to a single facet of said electrode for directly heating the workpieces accommodated on said single facet by direct backside heating thereof;

a planar source-mounting plate positioned outside said electrode in a parallel relationship with said heating element and in close proximity to said single facet; and a source material of a flat plate configuration affixed to said source-mounting plate to face said front surfaces of said workpieces accommodated on said single facet.

4. The apparatus as in claim 3 further comprising:

a second planar heating element mounted interior to said electrode and adjacent to said first heating element, said second element being parallel to and in close proximity with another facet of said electrode, said another facet being adjacent to said single facet for initially heating the workpieces on said another facet via their exposed back surfaces.

5. The apparatus as in claim 3 wherein said source material is selected from a group consisting of platinum, tantalum, palladium, titanium, titanium-tungsten and aluminum.

* * * * *